US010461385B2

(12) United States Patent
Sliwa et al.

(10) Patent No.: US 10,461,385 B2
(45) Date of Patent: Oct. 29, 2019

(54) JOSEPHSON JUNCTION-BASED CIRCULATORS AND RELATED SYSTEMS AND METHODS

(71) Applicant: Yale University, New Haven, CT (US)

(72) Inventors: Katrina Sliwa, New Haven, CT (US); Michael Hatridge, New Haven, CT (US); Anirudh Narla, New Haven, CT (US); Shyam Shankar, New Haven, CT (US); Luigi Frunzio, North Haven, CT (US); Robert J. Schoelkopf, III, Madison, CT (US); Michel Devoret, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/553,041

(22) PCT Filed: Feb. 26, 2016

(86) PCT No.: PCT/US2016/019819
§ 371 (c)(1),
(2) Date: Aug. 23, 2017

(87) PCT Pub. No.: WO2016/138406
PCT Pub. Date: Sep. 1, 2016

(65) Prior Publication Data
US 2018/0040935 A1 Feb. 8, 2018

Related U.S. Application Data

(60) Provisional application No. 62/126,423, filed on Feb. 27, 2015.

(51) Int. Cl.
*H01P 1/383* (2006.01)
*H01L 39/22* (2006.01)
(Continued)

(52) U.S. Cl.
CPC ............ *H01P 1/383* (2013.01); *H01L 39/223* (2013.01); *H01P 1/38* (2013.01); *H03F 3/60* (2013.01);
(Continued)

(58) Field of Classification Search
CPC ... H03F 7/04; H03F 1/26; H03F 3/195; H03F 3/608; H03F 7/00; H01L 39/223; H01P 5/18; H01P 1/38; H01P 1/383; H01P 1/39
(Continued)

(56) References Cited

U.S. PATENT DOCUMENTS 3,275,943 A 9/1966 Robert
3,663,886 A 5/1972 Blume
(Continued)

FOREIGN PATENT DOCUMENTS

CA 2 470 845 A1 6/2003
EP 0 513 856 A2 11/1992
(Continued)

OTHER PUBLICATIONS

Bergeal et al.,"Analog information processing at the quantum limit with a Josephson ring modulator", Nature Physics, Feb. 14, 2010, pp. 1-7.*
(Continued)

*Primary Examiner* — Benny T Lee
*Assistant Examiner* — Hafizur Rahman
(74) *Attorney, Agent, or Firm* — Wolf, Greenfield & Sacks, P.C.

(57) ABSTRACT

According to some aspects, a circuit is provided comprising a plurality of Josephson junctions arranged in series in a loop, at least one magnetic element producing magnetic flux through the loop, a plurality of superconducting resonators, each resonator coupled to the loop between a different neighboring pair of Josephson junctions of the plurality of
(Continued)

Josephson junctions, a plurality of ports, each port coupled to at least one of the plurality of resonators at ends of the resonators opposite to ends at which the resonators are coupled to the loop, and at least one controller configured to provide input energy to each of the plurality of ports that causes the circuit to function as a circulator between the plurality of ports.

18 Claims, 7 Drawing Sheets

(51) Int. Cl.
  *H03F 3/60* (2006.01)
  *H03F 19/00* (2006.01)
  *H01P 1/38* (2006.01)
(52) U.S. Cl.
  CPC ............ *H03F 3/605* (2013.01); *H03F 19/00* (2013.01); *H03F 2200/192* (2013.01); *H03F 2200/198* (2013.01); *H03F 2200/204* (2013.01)
(58) Field of Classification Search
  USPC ............................................ 333/1.1; 330/4.5
  See application file for complete search history.

(56) References Cited

U.S. PATENT DOCUMENTS

| 4,344,052 | A |   | 8/1982  | Davidson |
| 4,403,189 | A |   | 9/1983  | Simmonds |
| 4,585,999 | A |   | 4/1986  | Hilbert et al. |
| 4,956,312 | A |   | 9/1990  | Van Laarhoven |
| 5,105,166 | A | * | 4/1992  | Tsukii .................... H03F 3/607 |
|           |   |   |         | 330/277 |
| 5,254,950 | A |   | 10/1993 | Fan et al. |
| 5,326,986 | A |   | 7/1994  | Miller, Jr. et al. |
| 5,493,719 | A |   | 2/1996  | Smith et al. |
| 5,582,877 | A |   | 12/1996 | Nagamachi et al. |
| 5,635,834 | A |   | 6/1997  | Sloggett et al. |
| 5,661,494 | A |   | 8/1997  | Bondyopadhyay |
| 5,920,811 | A |   | 7/1999  | Suzuki et al. |
| 6,549,059 | B1 |  | 4/2003  | Johnson |
| 6,578,018 | B1 |  | 6/2003  | Ulyanov |
| 6,621,374 | B2 |  | 9/2003  | Higgins et al. |
| 6,627,915 | B1 |  | 9/2003  | Ustinov et al. |
| 6,635,898 | B2 |  | 10/2003 | Williams et al. |
| 6,822,255 | B2 |  | 11/2004 | Tzalenchuk et al. |
| 6,838,694 | B2 |  | 1/2005  | Esteve et al. |
| 6,900,454 | B2 |  | 5/2005  | Blais et al. |
| 6,911,664 | B2 |  | 6/2005  | Il'ichev et al. |
| 6,943,368 | B2 |  | 9/2005  | Amin et al. |
| 7,042,005 | B2 |  | 5/2006  | Il'ichev et al. |
| 7,129,869 | B2 |  | 10/2006 | Furuta et al. |
| 7,253,654 | B2 |  | 8/2007  | Amin |
| 7,307,275 | B2 |  | 12/2007 | Lidar et al. |
| 7,364,923 | B2 |  | 4/2008  | Lidar et al. |
| 7,369,093 | B2 |  | 5/2008  | Oppenländer et al. |
| 7,443,720 | B2 |  | 10/2008 | Astafiev et al. |
| 7,498,832 | B2 |  | 3/2009  | Baumgardner et al. |
| 7,533,068 | B2 |  | 5/2009  | Maassen van den Brink et al. |
| 7,724,083 | B2 |  | 5/2010  | Herring et al. |
| 7,800,395 | B2 |  | 9/2010  | Johnson et al. |
| 7,876,248 | B2 |  | 1/2011  | Berkley et al. |
| 7,899,092 | B2 |  | 3/2011  | Malinovsky |
| 7,932,515 | B2 |  | 4/2011  | Bunyk et al. |
| 8,032,474 | B2 |  | 10/2011 | Macready et al. |
| 8,106,717 | B2 |  | 1/2012  | Ichimura et al. |
| 8,111,083 | B1 |  | 2/2012  | Pesetski et al. |
| 8,138,784 | B2 |  | 3/2012  | Przybysz et al. |
| 8,179,133 | B1 |  | 5/2012  | Kornev et al. |
| 8,416,109 | B2 |  | 4/2013  | Kirichenko |
| 8,508,280 | B2 |  | 8/2013  | Naaman et al. |
| 8,514,478 | B1 |  | 8/2013  | Spence |
| 8,922,239 | B2 |  | 12/2014 | Pesetski et al. |

| 9,467,126 | B1 |   | 10/2016 | Naaman et al. |
| 9,892,365 | B2 | * | 2/2018  | Rigetti ................ G06N 99/002 |
| 9,948,254 | B2 |   | 4/2018  | Narla et al. |
| 2001/0025012 | A1 |   | 9/2001  | Tarutani et al. |
| 2002/0188578 | A1 |   | 12/2002 | Amin et al. |
| 2003/0136973 | A1 |   | 7/2003  | Ogawa et al. |
| 2003/0193097 | A1 |   | 10/2003 | Il'ichev et al. |
| 2004/0059760 | A1 |   | 3/2004  | Ageishi et al. |
| 2004/0077503 | A1 |   | 4/2004  | Blais et al. |
| 2004/0140537 | A1 |   | 7/2004  | Il'ichev et al. |
| 2005/0001209 | A1 |   | 1/2005  | Hilton et al. |
| 2005/0117836 | A1 |   | 6/2005  | Franson et al. |
| 2005/0134377 | A1 |   | 6/2005  | Dent |
| 2005/0224784 | A1 |   | 10/2005 | Amin et al. |
| 2006/0097747 | A1 |   | 5/2006  | Amin |
| 2006/0179029 | A1 |   | 8/2006  | Vala et al. |
| 2007/0215862 | A1 |   | 9/2007  | Beausoleil et al. |
| 2007/0296953 | A1 |   | 12/2007 | Allen et al. |
| 2008/0100175 | A1 |   | 5/2008  | Clark |
| 2008/0274898 | A1 |   | 11/2008 | Johnson et al. |
| 2008/0297230 | A1 |   | 12/2008 | Dzurak et al. |
| 2009/0028340 | A1 |   | 1/2009  | Trifonov |
| 2009/0033369 | A1 |   | 2/2009  | Baumgardner et al. |
| 2009/0074355 | A1 |   | 3/2009  | Beausoleil et al. |
| 2009/0153180 | A1 |   | 6/2009  | Herring et al. |
| 2009/0232191 | A1 |   | 9/2009  | Gupta et al. |
| 2009/0258787 | A1 |   | 10/2009 | Wilkie et al. |
| 2009/0289638 | A1 |   | 11/2009 | Farinelli et al. |
| 2010/0241780 | A1 |   | 9/2010  | Friesen |
| 2010/0246152 | A1 |   | 9/2010  | Lin et al. |
| 2011/0060710 | A1 |   | 3/2011  | Amin |
| 2011/0079889 | A1 |   | 4/2011  | Baillin |
| 2012/0074509 | A1 |   | 3/2012  | Berg et al. |
| 2012/0319085 | A1 |   | 12/2012 | Gambetta et al. |
| 2012/0319684 | A1 |   | 12/2012 | Gambetta et al. |
| 2012/0326130 | A1 |   | 12/2012 | Maekawa et al. |
| 2012/0326720 | A1 |   | 12/2012 | Gambetta et al. |
| 2013/0029848 | A1 |   | 1/2013  | Gonzalez et al. |
| 2013/0043945 | A1 |   | 2/2013  | McDermott et al. |
| 2013/0107352 | A1 |   | 5/2013  | Santori et al. |
| 2013/0196855 | A1 |   | 8/2013  | Poletto et al. |
| 2013/0271265 | A1 |   | 10/2013 | Finn |
| 2014/0167836 | A1 |   | 6/2014  | Gambetta et al. |
| 2014/0314419 | A1 |   | 10/2014 | Paik |
| 2015/0241481 | A1 |   | 8/2015  | Narla et al. |
| 2016/0308502 | A1 |   | 10/2016 | Abdo et al. |
| 2017/0039481 | A1 |   | 2/2017  | Abdo |
| 2018/0054165 | A1 |   | 2/2018  | Szocs et al. |
| 2018/0138987 | A1 |   | 5/2018  | Sliwa et al. |
| 2018/0198427 | A1 |   | 7/2018  | Narla et al. |
| 2019/0020346 | A1 |   | 1/2019  | Wang et al. |

FOREIGN PATENT DOCUMENTS

| EP | 2 249 173 A1 | 11/2010 |
| EP | 2 264 799 A1 | 12/2010 |
| GB | 1 370 647 A | 10/1974 |
| JP | 2-924421 | 7/1999 |
| JP | 2006-344761 A | 12/2006 |
| RU | 2 106 717 C1 | 3/1998 |
| RU | 2 212 671 C1 | 9/2003 |
| RU | 2010 124 198 A | 12/2011 |
| WO | WO 2017/065856 A1 | 4/2017 |

OTHER PUBLICATIONS

Campagne-Ibarcq et al. ,"Persistent control of a superconducting qubit by stroboscopic measurement feedback", Physical Review. May 29, 2013, pp. 1-7.*
Koch et al. ,"Time-reversal symmetry breaking in circuit-QED based photon lattices", Physical Review A 82, American Physical Society, 043811, Oct. 11, 2011, pp. 1-18.*
Partial Supplementary European Search Report for Application No. EP 14854592.4 dated Mar. 29, 2017.
Extended European Search Report for European Application No. EP 14854592.4 dated Aug. 10, 2017.
International Search Report and Written Opinion for International Application No. PCT/US2014/060694 dated Apr. 2, 2015.

(56) References Cited

OTHER PUBLICATIONS

International Preliminary Report on Patentability for International Application No. PCT/US2014/060694 dated Apr. 28, 2016.
Extended European Search Report for European Application No. EP 16756465.7 dated Sep. 28, 2018.
International Search Report and Written Opinion for International Application No. PCT/U52016/019821 dated May 6, 2016.
International Preliminary Report on Patentability for International Application No. PCT/US2016/019821 dated Sep. 8, 2017.
Extended European Search Report for European Application No. EP 16756463.2 dated Sep. 7, 2018.
International Search Report and Written Opinion for International Application No. PCT/U52016/019819 dated May 3, 2016.
International Preliminary Report on Patentability for International Application No. PCT/US2016/019819 dated Sep. 8, 2017.
Invitation to Pay Additional Fees for International Application No. PCT/US2016/027817 dated Jun. 3, 2016.
International Search Report and Written Opinion for International Application No. PCT/US2016/027817 dated Aug. 22, 2016.
International Preliminary Report on Patentability for International Application No. PCT/US2016/027817 dated Oct. 26, 2017.
International Search Report and Written Opinion for International Application No. PCT/US2017/013426 dated Apr. 5, 2017.
International Preliminary Report on Patentability for International Application No. PCT/US2017/013426 dated Jul. 26, 2018.
Abdo et al., Full coherent frequency conversion between two propagating microwave modes. Phys Rev Lett. Apr. 26, 2013;110:173902.1-5. doi: 10.1103/PhysRevLett.110.173902.
Abdo et al., Josephson directional amplifier for quantum measurement of superconducting circuits. Phys Rev Lett. Apr. 25, 2014;112:167701.1-5. doi: 10.1103/PhysRevLett.112.167701.
Abdo et al., Nondegenerate three-wave mixing with the Josephson ring modulator. Phys Rev B. Jan. 16, 2013;87(1):014508.1-18. doi: 10.1103/PhysRevB.87.014508.
Albert et al., Holonomic quantum computing with cat-codes. Apr. 10, 2015. arXiv:1503.00194v2. 5 pages.
Albert et al., Symmetries and conserved quantities in Lindblad master equations. Phys Rev A. Feb. 2014;89(2):022118. arXiv:1310.1523v2. 15 pages.
Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.
Bergeal et al., Phase-preserving amplification near the quantum limit with a Josephson ring modulator. Nature Physics. Letters. 2010;465:64-9.
Bergeal et al., Phase-preserving amplification near the quantum limit with a Josephson ring modulator. Nature. May 2010;465(7294):64-8. arXiv:0912.3407v1. 20 pages.
Burgarth et al., Non-Abelian phases from quantum Zeno dynamics. Phys Rev A. Oct. 9, 2013;88:042107.1-5. doi: 10.1103/PhysRevA.88.042107.
Carollo et al., Coherent Quantum Evolution via Reservoir Driven Holonomy. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.
Castellanos-Beltran et al., Amplification and squeezing of quantum noise with a tunable Josephson metamaterial. Nat Phys. Dec. 2008;4(12):928-31.
Castellanos-Beltran et al., Widely tunable parametric amplifier based on a superconducting quantum interference device array resonator. Applied Physics Letters. 2007;91(8). 4 pages.
Chaturvedi et al., Berry's phase for coherent states. J Phys A: Math Gen. 1987;20(16):L1071-5.
Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.
De Ponte et al., Relaxation- and decoherence-free subspaces in networks of weakly and strongly coupled resonators. Ann Phys. Mar. 12, 2007;322:2077-84.
Devoret et al., Superconducting Circuits for Quantum Information: An Outlook. Science. Mar. 8, 2013;339:1169-74. doi: 10.1126/science.1231930.
Duan et al., Preserving Coherence in Quantum Computation by Pairing Quantum Bits. Phys Rev Lett. Sep. 8, 1997;79(10-8):1953-6.
Eichler et al., Controlling the dynamic range of a Josephson parametric amplifier. EPJ Quantum Tech. Jan. 29, 2014;1(2). doi:10.1140/epjqt2. 19 pages.
Facchi et al., Quantum Zeno Subspaces. Phys Rev Lett. Aug. 19, 2002;89(8):080401.1-4.
Heeres et al., Cavity State Manipulation Using Photon-Number Selective Phase Gates. Phys Rev Lett. Sep. 25, 2015;115:137002.1-5. doi: 10.1103/PhysRevLett.115.137002.
Hofheinz et al., Synthesizing arbitrary quantum states in a superconducting resonator. Nature. May 28, 2009;459:546-9. doi:10.1038/nature08005. Supplementary Information. 6 pages.
Houck et al., Life after charge noise: recent results with transmon qubits. Quantum Info Process. Feb. 11, 2009;8(2-3):105-15.
Hover et al., High fidelity qubit readout with the superconducting lowinductance undulatory galvanometer microwave amplifier. Appl Phys Lett. 2014;104;152601.1-4.
Hover et al., Superconducting Low-inductance Undulatory Galvanometer Microwave Amplifier. Appl Phys Lett. Feb. 7, 2012;100:063503.1-3.
Johnson et al., Dispersive readout of a flux qubit at the single photon level. Phys Rev B. 2011;84:220503. arXiv:1109.2858v2. 5 pages.
Kamal et al., Gain, directionality, and noise in microwave SQUID amplifiers: Input-output approach. Phys Rev B. 2012;86:144510.1-12. doi: 10.1103/PhysRevB.86.144510.
Kerckhoff et al., On-chip superconducting microwave circulator from synthetic rotation. Phys Rev Appl. 2015;4:034002. arXiv:1502.06041. Submitted Feb. 21, 2015. 13 pages.
Kirchmair et al., Observation of quantum state collapse and revival due to the single-photon Kerr effect. Nature. Mar. 14, 2013;495:205-9. doi:10.1038/nature11902.
Knill et al., Theory of Quantum Error Correction for General Noise. Phys Rev Lett. Mar. 13, 2000;84(11):2525-8. arXiv:quant-ph/9908066v1. 6 pages.
Krastanov et al., Universal Control of an Oscillator with Dispersive Coupling to a Qubit. Phys Rev A. 2015;92:040303. arXiv:1502.08015. Submitted Feb. 27, 2015. 5 pages.
Leghtas et al., Confining the state of light to a quantum manifold by engineered two-photon loss. Dec. 16, 2014. arXiv:1412.4633v1. 29 pages.
Lidar et al., Decoherence Free Subspaces for Quantum Computation. Phys Rev Lett. Sep. 21, 1998;81(12):2594-7. arXiv:quant-ph/9807004v2. 4 pages.
Lindblad, On the generators of quantum dynamical semigroups. Commun Math Phys. 1976;48(2):119-30.
Minev et al., Planar Superconducting Whispering Gallery Mode Resonators. Appl Phys Lett. Oct. 3, 2013;103:142604.1-3. doi: 10.1063/1.4824201.
Mirrahimi et al., Dynamically protected cat-qubits: a new paradigm for universal quantum computation. New J Phys. Apr. 22, 2014;16:045014. 31 pages.
Mousolou et al., Universal non-adiabatic holonomic gates in quantum dots and single-molecule magnets. New J Phys. Jan. 17, 2014;16:013029. 10 pages.
Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.
Narla et al., Wireless Josephson amplifier. Appl Phys Lett. 2014;104:232605. doi: 10.1063/1.4883373. 6 pages.
O'Brien et al., Resonant Phase Matching of Josephson Junction Traveling Wave Parametric Amplifiers. Phys Rev Lett. Oct. 10, 2014;113:157001.1-5.
Oreshkov et al., Adiabatic Markovian Dynamics. Phys Rev Lett. Jul. 30, 2010;105(5):050503. arXiv:1002.2219v4. 7 pages.

(56) References Cited

OTHER PUBLICATIONS

Oreshkov et al., Fault-Tolerant Holonomic Quantum Computation. Phys Rev Lett. Feb. 20, 2009;102:070502.1-4.
Oreshkov, Holonomic Quantum Computation in Subsystems. Phys Rev Lett. Aug. 28, 2009;103(9):090502. arXiv:0905.1249v3. 5 pages.
Pachos et al., Decoherence-free dynamical and geometrical entangling phase gates. Phys Rev A. 2004;69:033817. arXiv:quant-ph/0309180v3. 10 pages.
Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.
Pasi et al., Advanced Concepts in Josephson Junction Reflection Amplifiers. Journal of Low Temperature Physics. 2014;175(5-6):868-76.
Paz-Silva et al., Zeno Effect for Quantum Computation and Control. Phys Rev Lett. Feb. 24, 2012;108(8):080501. arXiv:1104.5507v2. 7 pages.
Pillet et al., Optimal design for the Josephson mixer. Mar. 30, 2015. arXiv:1503.08185v1. 5 pages.
Pillet, Amplification, entanglement and storage of microwave radiation using superconducting circuits. University of Virginia. Seminar. 2014;1-78.
Platenberg, Coupled superconducting flux qubits. Delft University of Technology. Thesis. 2007. 153 pages.
Ranzani et al., Graph-based analysis of nonreciprocity in coupled-mode systems. New J Phys. Oct. 15, 2014;17:023024. arXiv 2014;1406.4922v2. 21 pages.
Ristèet al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.
Roch et al., Observation of measurement-induced entanglement and quantum trajectories of remote superconducting qubits. Phys Rev Lett. May 2, 2014;112:170501.1-5.
Roch et al., Widely Tunable, Non-degenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.
Sarandy et al., Abelian and non-Abelian geometric phases in adiabatic open quantum systems. Phys Rev A. Jun. 2006;73(6):062101. arXiv:quant-ph/0507012v3. 10 pages.
Schackert et al., A Practical Quantum-Limited Parametric Amplifier Based on the Josephson Ring Modulator. A Dissertation Presented to the Faculty of the Graduate School of Yale University in Candidacy for the Degree of Doctor of Philosophy. Dec. 2013.
Schackert et al., Phase-preserving amplification near the quantum limit with a Josephson ring modulator. Nature. May 2010;465(7294):64-8. arXiv:0912.3407v1. 20 pagse.
Schindler et al., Quantum simulation of open-system dynamical maps with trapped ions. Nature Phys. May 19, 2013;9:361-7. arXiv:1212.2418v1. 28 pages.
Siddiqi et al., An RF-Driven Josephson Bifurcation Amplifier for Quantum Measurements. Phys Rev Lett. Nov. 10, 2004;93:207002. arXiv:cond-mat/0312623v1. 4 pages.
Sjöqvist, Trends: A new phase in quantum computation. Phys. 2008;1:35. doi: 10.1103/Physics.1.35. 6 pages.
Spietz et al., Input Impedance and Gain of a Gigahertz Amplifier Using a DC SQUID in a Quarter Wave Resonator. Appl Phys Lett. Jun. 17, 2008;93:082506. arXiv:0806.2853v1. 4 pages.
Vijay et al., Observation of Quantum Jumps in a Superconducting Artificial Atom. Phys Rev Lett. Mar. 18, 2011;106(11):110502.1-4.
Wang, Memristors and Superconducting Quantum Interference Filters in RF Systems. Department of Electrical and Computer Engineering, Duke University. Thesis. Aug. 18, 2014. 119 pages.
Wendin et al., Superconducting quantum circuits, qubits and computing. arXiv:cond-mat/0508729v1. Aug. 30, 2005. 60 pages.

Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17):170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301.1-9. doi: 10.1103/PhysRevB.87.144301.
Zanardi et al., Coherent quantum dynamics in steady-state manifolds of strongly dissipative systems. Phys Rev Lett. Dec. 17, 2014;113:240406. arXiv:1404.4673. 6 pages.
Zanardi et al., Geometry, robustness, and emerging unitarity in dissipation-projected dynamics. Phys Rev A. 2015;91:052324. arXiv:1412.6198. 8 pages.
Zanardi et al., Holonomic Quantum Computation. Phys Lett A. Nov. 15, 1999;264:94-9. 5 pages.
Zanardi et al., Noiseless Quantum Codes. Phys Rev Lett. Oct. 27, 1997;79(17):3306-9. arXiv:quant-ph/9705044v2. 4 pages.
Zanardi, Stabilizing Quantum Information. Phys Rev A. Dec. 5, 2000;63(1):012301. arXiv:quant-ph/9910016v2. 5 pages.
Zanardi, Virtual Quantum Subsystems. Phys Rev Lett. Aug. 13, 2001;87(7):077901. arXiv:quant-ph/0103030v2. 4 pages.
Zhang et al., Physical implementation of holonomic quantum computation in decoherence-free subspaces with trapped ions. Phys Rev A. 2006;74:034302. arXiv:quant-ph/0608068v1. 4 pages.
Zheng, Dissipation-induced geometric phase for an atom in cavity QED. Phys Rev A. May 10, 2012;85(5):052106. arXiv:1205.0984v2. 7 pages.
Zheng, Open-system geometric phase based on system-reservoir joint state evolution. Phys Rev A. Jun. 27, 2014;89:062118. arXiv:1405.1227v1. 8 pages.
Zhou et al., High-gain weakly nonlinear flux-modulated Josephson parametric amplifier using a SQUID array. Physical Review. 2014;89(21). 6 pages.
Zhu et al., Geometric quantum gates robust against stochastic control errors. Phys Rev A. Aug. 15, 2005;72(2):020301. arXiv:quant-ph/0407177v1. 4 pages.
Zueco et al., Qubit-oscillator dynamics in the dispersive regime: analytical theory beyond the rotating-wave approximation. Physical Review A 80.3 2009. 6 pages.
U.S. Appl. No. 15/029,666, filed Apr. 15, 2016, Abdo et al.
U.S. Appl. No. 16/160,897, filed Oct. 15, 2018, Abdo et al.
U.S. Appl. No. 15/914,995, filed Mar. 7, 2018, Narla et al.
U.S. Appl. No. 15/553,030, filed Aug. 23, 2017, Szöcs et al.
U.S. Appl. No. 15/553,041, filed Aug. 23, 2017, Sliwa et al.
U.S. Appl. No. 15/567,198, filed Oct. 17, 2017, Sliwa et al.
U.S. Appl. No. 16/068,405, filed Jul. 6, 2018, Wang et al.
EP 14854592.4, dated Mar. 29, 2017, Partial Supplementary European Search Report.
EP 14854592.4, dated Aug. 10, 2017, Extended European Search Report.
PCT/US2014/060694, dated Apr. 2, 2015, International Search Report and Written Opinion.
PCT/US2014/060694, dated Apr. 28, 2016, International Preliminary Report on Patentability.
EP 16756465.7, dated Sep. 28, 2018, Extended European Search Report.
PCT/US2016/019821, dated May 6, 2016, International Search Report and Written Opinion.
PCT/US2016/019821, dated Sep. 8, 2017, International Preliminary Report on Patentabililty.
EP 16756463.2, dated Sep. 7, 2018, Extended European Search Report.
PCT/US2016/019819, dated May 3, 2016, International Search Report and Written Opinion.
PCT/US2016/019819, dated Sep. 8, 2017, International Preliminary Report on Patentability.
PCT/US2016/027817, dated Jun. 3, 2016, Invitation to Pay Additional Fees.

(56) References Cited

OTHER PUBLICATIONS

PCT/US2016/027817, dated Aug. 22, 2016, International Search Report and Written Opinion.
PCT/US2016/027817, dated Oct. 26, 2017, International Preliminary Report on Patentability.
PCT/US17/13426, dated Apr. 5, 2017, International Search Report and Written Opinion.
PCT/US17/13426, dated Jun. 3, 2016, International Preliminary Report on Patentability.
Extended European Search Report for European Application No. 16780864.1, dated Mar. 5, 2019.
International Search Report and Written Opinion for International Application No. PCT/US2018/064922, dated Mar. 8, 2019.
Abdo et al., Josephson amplifier for qubit readout. Appl Phys Lett. 2011; 99(16): 162506. doi: 10.1063/1.3653473.
Araujo et al., A LEKID-based CMB instrument design for large-scale observations in Greenland. Proc of SPIE—The International Society for Optical Engineering. Aug. 4, 2014;9153:91530W. doi: 10.1117/12.2056828.
Barends et al., Minimizing quasiparticle generation from stray infrared light in superconducting quantum circuits, Appl Phys Lett. Sep. 13, 2011;99(11):113507.
Bockstiegel et al., Development of broadband NbTiN traveling wave parametric amplifier for MKID readout. J Low Temp Phys. 2014;176:476-82.
Campagne-Ibarcq et al., Observing quantum state diffusion by heterodyne detection of fluorescence. Phys Rev X. 2016;6:011002.
Catelani et al., Relaxation and frequency shifts induced by quasiparticles in superconducting qubits, Phys Rev B. 2011;84(6) 064517.
Caves, Quantum limits on noise in linear amplifiers. Phys. Rev. D. 1982;26(8):1817-39.
Corcoles et al., Protecting superconducting qubits from radiation. App Phys Lett. 2011;99(18):181906.
Court et al., Quantitative study of quasiparticle traps using the single-Cooper-pair transistor. Phys Rev B. 2008;77(10):100501.
De Lange et al., Reversing quantum trajectories with analog feedback. Phys Rev Lett. 2014;112:080501.
Dolan, Offset masks for lift-off photoprocessing. App Phys Lett. 1977;31(5):337-9.
Flurin et al., Superconducting quantum node for entanglement and storage of microwave radiation. Phys Rev Lett. Mar. 6, 2015;114(9):090503. Epub Mar. 4, 2015.
Flurin et al., Generating entangled microwave radiation over two transmission lines. Phys Rev Lett. Nov. 2, 2012;109(18):183901. Epub Oct. 31, 2012.
Frattini et al., 3-wave mixing Josephson dipole element. App Phys Lett. 2017;110:222603-4.
Friedrich et al., Experimental quasiparticle dynamics in a superconducting, imaging x-ray spectrometer, App Phys Lett. 1997;71(26):3901.
Golubov et al., Quasiparticle lifetimes and tunneling times in a superconductor-insulator-superconductor tunnel junction with spatially inhomogeneous electrodes. Phys Rev B Condens Matter. May 1, 1994;49(18):12953-68.
Gueron, Quasiparticles in a diffusive conductor: interaction and pairing, Universite Pierre et Marie Curie—Paris VI. 1997, 241 pages.
Hatridge et al., Dispersive magnetometry with a quantum limited SQUID parametric amplifier. Phys Rev B. Apr. 2011;83(13):134501-1-8.
Hatridge et al., Quantum back-action of an individual variable-strength measurement. Science. Jan. 11, 2013; 339(6116): 178-81. doi: 10.1126/science.1226897.
Ho Eom et al., A wideband, low-noise superconducting amplifier with high dynamic range. Nature Physics. 2012;8(8):623-7.
Kamal et al., Noiseless nonreciprocity in a parametric active device. Nature Physics. 2011;7:311-315.
Kamal et al., Signal-to-pump back action and self-oscillation in double-pump Josephson parametric amplifier. Phys. Rev. B. May 13, 2009;79:184301.
Liu et al., Comparing and combining measurement-based and driven-dissipative entanglement stabilization. Phys. Rev. X. 2016;6:011022.
Macleod et al., Periodicity in Al/Ti superconducting single electron transistors. App Phys Lett. Aug. 3, 2009;95:052503.
Martinis et al., Calculation of Tc in a normal-superconductor bilayer using the microscopic-based Usadel theory. Nucl Instrum Methods Phys Res A. 2000;444(1)2:23-27.
Martinis et al., Energy decay in superconducting Josephson-Junction qubits from nonequilibrium quasiparticle excitations. Phys Rev Lett. 2009;103(9):097002.
Metelmann et al., Nonreciprocal photon transmission and amplification via reservoir engineering. Phys. Rev. X. 2015(5):021025.
Murch et al., Observing single quantum trajectories of a superconducting quantum bit. Nature. Oct. 10, 2013;502(7470):211-4. doi: 10.1038/nature12539.
Mutus et al., Design and characterization of a lumped element single-ended superconducting microwave parametric amplifier with on-chip flux bias line. App Phys Lett. Sep. 17, 2013;103:122602.
Narla et al., Robust concurrent remote entanglement between two superconducting qubits. Phys Rev X. 2016;6:031036.
Nsanzineza et al., Trapping a single vortex and reducing quasiparticles in a superconducting resonator. Phys Rev Lett. Sep. 12, 2014;113(11): 117002. Epub Sep. 12, 2014.
Ofek et al., Demonstrating quantum error correction that extends the lifetime of quantum information. Nature. 2016;536:441-445.
Peltonen et al., Magnetic-field-induced stabilization of nonequilibrium superconductivity in a normal-metal/insulator/superconductor junction. Phys Rev B. 2011;84(22):220502.
Pop et al., Coherent suppression of electromagnetic dissipation due to superconducting quasiparticles. Nature. Apr. 17, 2014;508(7496):369-72. doi: 10.1038/nature13017.
Rigetti et al., Superconducting qubit in a waveguide cavity with a coherence time approaching 0.1 ms. Phys Rev B. 2012;86:100506.
Ristè et al., Millisecond charge-parity fluctuations and induced decoherence in a superconducting transmon qubit. Nat Commun. 2013;4:1913. doi: 10.1038/ncomms2936.
Segall et al., Dynamics and energy distribution of nonequilibrium quasiparticles in superconducting tunnel junctions. Physical Review B. 2004;70(21):214520.
Shankar et al., Autonomously stabilized entanglement between two superconducting quantum bits. Nature. Dec. 19, 2013;504(7480):419-22. doi:10.1038/nature12802. Epub Nov. 24, 2013.
Shaw et al., Kinetics of nonequilibrium quasiparticle tunneling in superconducting charge qubits. Phys Rev B. Jul. 1, 2008;78:024503.
Silveri et al., Theory of remote entaglement via quantum limited phase-preserving amplification. Phys Rev A. Jun. 7, 2016;93:062310.
Sirois et al., Coherent-state storage and retrieval between superconducting cavities using parametric frequency conversion. Appl Phys Lett. Apr. 30, 2015;106:172603.
Sliwa et al., Reconfigurable Josephson Circulator/Directional Amplifier. Phys. Rev. X 2015;5:041020.
Smith et al., Low noise papametric amplifier. IEEE Transactions on Magnetics. Mar. 1985;MAG-21(2):1022-8.
Sun et al., Measurements of Quasiparticle Tunneling Dynamics in a Band-Gap-Engineered Transmon Qubit. Phys Rev Lett. Jun. 8, 2012;108:230509. doi: 10.1103/PhysRevLett.108.230509.
Sun et al., Tracking photon jumps with repeated quantum non-demolition parity measurements. Nature. Jul. 24, 2014;511(7510):444-8. doi: 10.1038/nature13436. Epub Jul. 13, 2014.
Swenson et al., High-speed phonon imaging using frequency-multiplexed kinetic inductance detectors,. App Phys Lett. Jul. 1, 2010; 96:263511.
Usadel, Generalized Diffusion Equation for Superconducting Alloys. Phys Rev Lett. 1970;25(8):507.
Vijay et al., Invited Review Article: The Josephson bifurcation amplifier. Rev Sci Instrum. Nov. 17, 2009;80:111101. doi:10.1063/1.3224703.
Vijay et al., Quantum feedback control of a superconducting qubit: Persistent Rabi oscillations. Nature. Oct. 4, 2012;490(7418):77-80. doi: 10.1038/nature11505.
Vion et al., Manipulating the quantum state of an electrical circuit. Science. May 3, 2002;296(5569):886-9.

(56) References Cited

OTHER PUBLICATIONS

Visser et al., Fluctuations in the electron system of a superconductor exposed to a photon flux. Nat Commun. 2014;5:3130. doi: 10.1038/ncomms4130.

Vool et al., Non-Poissonian quantum jumps of a fluxonium qubit due to quasiparticle excitations. Phys Rev Lett. Dec. 12, 2014;113(24):247001. Epub Dec. 8, 2014.

Wang et al., A Schrödiner cat living in two boxes. Science. May 27, 2016;352(6289):1087.

Wang et al., Measurement and control of quasiparticle dynamics in a superconducting qubit, Nature Comms. Dec. 18, 2014; 5:5836. doi:10.1038/ncomms6836.

Wenner et al., Excitation of superconducting qubits from hot nonequilibrium quasiparticles. Phys Rev Lett. Apr. 12, 2013;110(15):150502. Epub Apr. 9, 2013.

Yamamoto et al., Flux-driven Josephson parametric amplifier. Appl Phys Lett Jul. 2008;93:042510. doi:10.1063/1.2964182.

Zhong et al., Squeezing with a flux-driven Josephson parametric amplifier. New J Phys. Dec. 2013;15:125013. doi:10.1088/1367-2630/15/12/125013.

Zorin, Josephson Traveling-Wave Parametric Amplifier with Three-Wave Mixing. Phys Rev Applied. Sep. 12, 2016;6:034006.

EP16780864.1, dated Mar. 5, 2019, Extended European Search Report.

PCT/US2018/064922, dated Mar. 8, 2019, International Search Report and Written Opinion.

\* cited by examiner

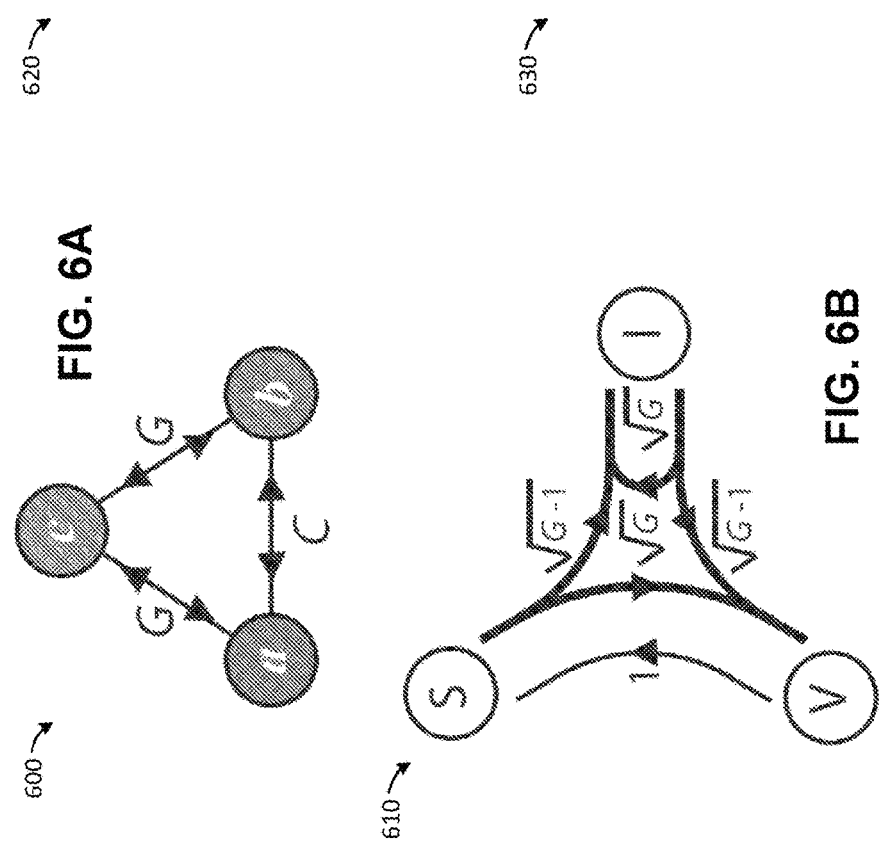
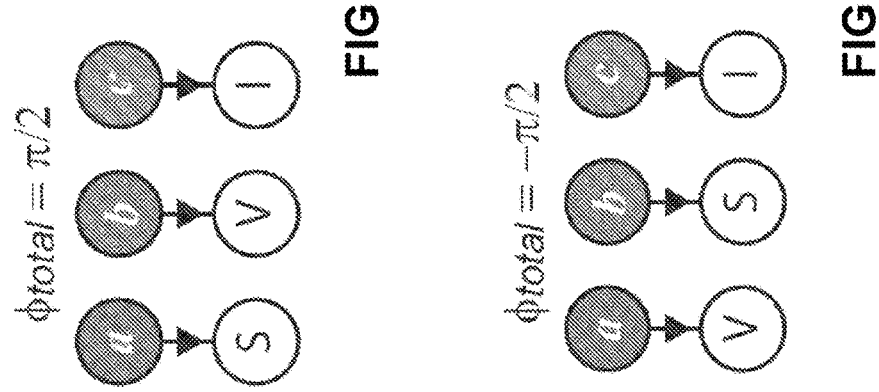
FIG. 6A
FIG. 6B
FIG. 6C
FIG. 6D

JOSEPHSON JUNCTION-BASED CIRCULATORS AND RELATED SYSTEMS AND METHODS

CROSS-REFERENCE TO RELATED APPLICATIONS

This application is the national phase filing under 35 U.S.C. § 371 of International Application No. PCT/US2016/019819, filed on Feb. 26, 2016, which claims priority to U.S. Provisional Patent Application No. 62/126,423, filed on Feb. 27, 2015, each of which are incorporated herein by reference to the maximum extent allowable.

FIELD

The present application relates generally to circulator circuits. More specifically, the present application relates to a quantum circuit that may be operated as a reversible circulator.

BACKGROUND

Connecting elements directionally so that information flows only one way is a requirement in signal processing. Directional elements route information from a source to a destination, while simultaneously preventing interference from signals passing through the chain in reverse. Canonically, separating an input from an output is performed by the circulator. A circulator is a component with a number of ports (typically three or four) that can operate in a sequence such that an input signal arriving at one port is output from the next port in the sequence.

A second important directional device is the two-port amplifier, which is used to increase signal power levels that are otherwise too weak to be successfully processed by subsequent elements. The directionality of an amplifier is specified by the reverse gain, i.e., the gain experienced by a signal traversing the amplifier in reverse, which is usually much less than unity for a directional amplifier.

SUMMARY

Some aspects are directed to a circuit comprising a plurality of Josephson junctions arranged in series in a loop, at least one magnetic element producing magnetic flux through the loop, a plurality of superconducting resonators, each resonator coupled to the loop between a different neighboring pair of Josephson junctions of the plurality of Josephson junctions, a plurality of ports, each port coupled to at least one of the plurality of resonators at ends of the resonators opposite to ends at which the resonators are coupled to the loop, and at least one controller configured to provide input energy to each of the plurality of ports that causes the circuit to function as a circulator between the plurality of ports.

According to some embodiments, the plurality of superconducting resonators are each capacitively coupled to one or more of the plurality of ports.

According to some embodiments, the Josephson junctions are positioned equidistantly around the loop.

According to some embodiments, the input energy comprises pumping signals provided to each of the plurality of ports, the pumping signals having different frequencies at each of the plurality of ports.

According to some embodiments, the input energy comprises a first pumping signal input to a first port of the plurality of ports, a second pumping signal input to a second port of the plurality of ports, and a third pumping signal input to a third port of the plurality of ports, the first port is associated with a first resonant mode of the circuit having a first resonance frequency, the second port is associated with a second resonant mode of the circuit having a second resonance frequency, and the third port is associated with a third resonant mode of the circuit having a third resonance frequency.

According to some embodiments, the first pumping signal has a primary frequency equal to a difference between the second resonance frequency and the third resonance frequency.

According to some embodiments, the second pumping signal has a primary frequency equal to a difference between the first resonance frequency and the third resonance frequency, and the third pumping signal has a primary frequency equal to a difference between the first resonance frequency and the second resonance frequency.

According to some embodiments, the circulator functions in a first direction between the ports, and a phase of the first pumping signal plus a phase of the second pumping signal minus a phase of the third pumping signal is equal to an odd integer multiple of $\pi/2$.

According to some embodiments, the phase of the first pumping signal plus the phase of the second pumping signal minus the phase of the third pumping signal is equal to an odd integer multiple of $-\pi/2$, and the circulator functions in a second direction between the ports, opposite to the first direction.

According to some embodiments, the input energy is first input energy, and the at least one controller is further configured to provide second input energy to each of the plurality of ports, different from the first input energy, that causes the circuit to function as a directional amplifier.

According to some embodiments, the second input energy comprises a first pumping signal input to a first port of the plurality of ports, a second pumping signal input to a second port of the plurality of ports, and a third pumping signal input to a third port of the plurality of ports, the first port is associated with a first resonant mode of the circuit having a first resonance frequency, the second port is associated with a second resonant mode of the circuit having a second resonance frequency, the third port is associated with a third resonant mode of the circuit having a third resonance frequency, and the first pumping signal has a primary frequency equal to a sum of the second resonance frequency and the third resonance frequency.

According to some embodiments, the second pumping signal has a primary frequency equal to a difference between the first resonance frequency and the third resonance frequency, and the third pumping signal has a primary frequency equal to a sum of the first resonance frequency and the second resonance frequency.

Some aspects are directed to a method of operating a circuit, the circuit comprising a plurality of Josephson junctions arranged in series in a loop, at least one magnetic element producing magnetic flux through the loop, a plurality of superconducting resonators, each resonator coupled to the loop between a different neighboring pair of Josephson junctions of the plurality of Josephson junctions, a plurality of ports, each port coupled to at least one of the plurality of resonators at ends of the resonators opposite to ends at which the resonators are coupled to the loop, the method comprising providing an input pumping signal to each of the plurality of ports to cause the circuit to function as a circulator between the plurality of ports.

According to some embodiments, each input pumping signal each has a different frequency.

According to some embodiments, a first input pumping signal is input to a first port of the plurality of ports, a second input pumping signal is input to a second port of the plurality of ports, and a third input pumping signal is input to a third port of the plurality of ports, the first port is associated with a first resonant mode of the circuit having a first resonance frequency, the second port is associated with a second resonant mode of the circuit having a second resonance frequency, the third port is associated with a third resonant mode of the circuit having a third resonance frequency, and the first input pumping signal has a primary frequency equal to a difference between the second resonance frequency and the third resonance frequency.

According to some embodiments, the second input pumping signal has a primary frequency equal to a difference between the first resonance frequency and the third resonance frequency, and the third input pumping signal has a primary frequency equal to a difference between the first resonance frequency and the second resonance frequency.

According to some embodiments, the circulator functions in a first direction between the ports, and a phase of the first input pumping signal plus a phase of the second input pumping signal minus a phase of the third input pumping signal is equal to an odd integer multiple of $\pi/2$.

According to some embodiments, the phase of the first input pumping signal plus the phase of the second input pumping signal minus the phase of the third input pumping signal is equal to an odd integer multiple of $-\pi/2$, and the circulator functions in a second direction between the ports, opposite to the first direction.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIGS. 6A-6D illustrate operation of the circuit of FIG. 2A as a directional amplifier, according to some embodiments.

DETAILED DESCRIPTION

Figure 1:
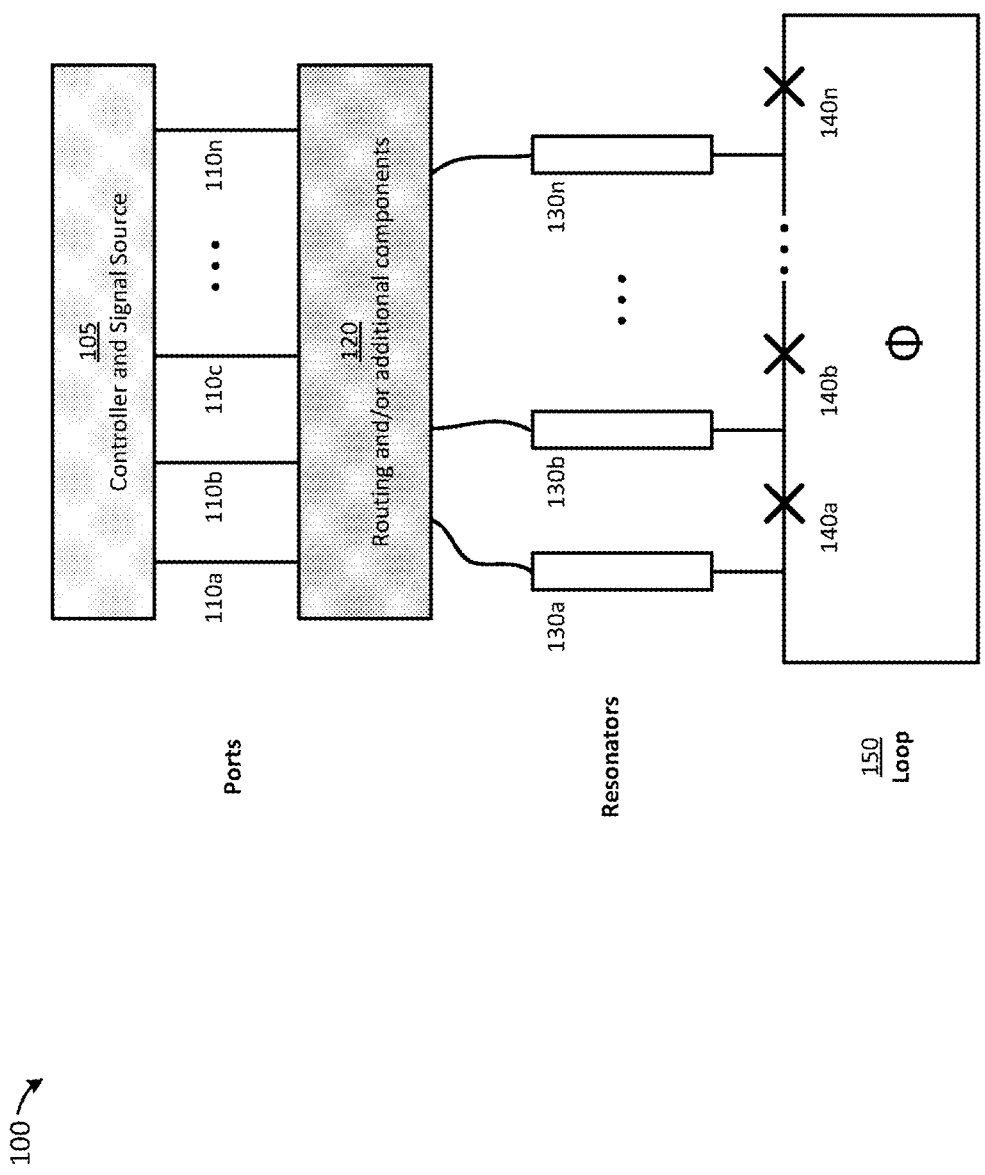
FIG. 1 is a block diagram of an integrated circulator/amplifier circuit, according to some embodiments.

Measurements of quantum systems often require probing of a quantum system using a signal containing only a few photons. Measuring such a weak signal with high fidelity frequently demands a high-gain, low-noise chain of amplifiers. In addition, circulators are often used to control the flow of energy around the quantum system. As discussed above, a circulator has a number of ports that can operate in a sequence such that an input signal arriving at one port is output from the next port in the sequence.

However, such circulators and amplifiers when used in a quantum circuit often produce unacceptable levels of noise. Even a relatively noiseless amplifier or circulator that causes reduces signal-to-noise by a mere 1 dB would cause a 25% reduction in the power of the signal. For the low power regime of quantum circuits, such an attenuation may be too great for the circuit to function as intended. While quantum noise sets a lower bound on the amount of noise that can be achieved, an ideal circulator or amplifier would be limited only by the quantum noise (sometimes referred to as being "quantum-limited").

The most widely chosen amplifiers for quantum circuits are superconducting parametric amplifiers, sometimes referred to as "paramps." Standard paramp designs are not directional, however, and instead amplify in reflection and require external circulators to separate incoming and outgoing signals. Moreover, commercially available circulators typically rely on ferrites and/or permanent magnets to distinguish between polarized waves propagating in different directions. Such materials tend to be bulky, thus limiting scalability of circuits in which they are used. In addition, their magnetic nature can make them incompatible with superconducting elements (e.g., qubits) within the circuit, and they may add noise to a signal in the circuit as a result of their insertion loss.

The inventors have recognized and appreciated that a circulator may be produced by exciting selected resonant modes of a circuit featuring a loop of Josephson junctions coupled to a number of resonators. In some embodiments, the same device may also be operated as a directional amplifier by changing only the frequencies and relative phases of one or more pump inputs used to excite the resonant modes. Moreover, in some embodiments the directionality of the circulator function may be switched simply by changing the relative phases of the pump inputs.

The integrated device described herein may be fabricated on-chip with qubit devices, as it avoids the bulky, magnetically biased ferrite materials used in commercial circulators. In some implementations, when functioning as a circulator, the device may add no noise by preserving the quantum state of light as it passes from one port to another; and in some implementations, when functioning as an amplifier, the device may produce noise that is quantum-limited.

Following below are more detailed descriptions of various concepts related to, and embodiments of, an integrated reversible circulator and directional amplifier. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 is a block diagram of an integrated circulator/amplifier circuit, according to some embodiments. Circuit 100 shown in FIG. 1 may be operated by the controller and signal source 105 to perform as a circulator or as a directional amplifier, although additional modes of operation other than circulator or amplifier are not necessarily excluded by the below description. Circuit 100 also includes a plurality of ports 110, a sub circuit 120 which routes the ports to one or more of the resonators 130, and a circuit loop 150 around which a number of Josephson junctions 140 are placed and interspersed with connections to the resonators 130. A magnetic flux 1 is directed through the interior of the loop 150, which may be generated by a suitable magnetic component (not shown).

In the example of FIG. 1, there may be one or more parametric processes that comprise one or more 2-body interactions between standing electromagnetic modes within the resonators 130a, 130b, ..., 130n which are coupled together via the loop 150 and the Josephson junctions 140a, 140b, ..., 140n. According to some embodiments, the standing electromagnetic modes may be within the microwave region of the electromagnetic spectrum. Input signals that excite these resonance modes may be used to operate the device as a circulator or amplifier, for instance, as described below.

While circuit 100 is depicted in FIG. 1 as having a particular physical layout, it is not intended that circuit 100 be limited to such a configuration. Rather, FIG. 1 is intended to demonstrate merely how the components of circuit 100 connect to one another and in general the components may be arranged in any suitable manner. In some embodiments, it may be preferable that some of the components of circuit 100 are arranged in a particular manner, examples of which are described below.

Controller and signal source 105 provides input energy comprising one or more signals to any one or more of the ports 110a, 110b, 110c, ..., 110n. In general, circuit 100 may include any number input ports, and while four input ports are illustrated the number of ports could be fewer in number than four. While a circulator traditionally has at least three ports, the system 100 could also, in some embodiments, be implemented with two ports to act as an isolator, although in general at least three ports are preferred in circuit 100 to provide circulator functionality that is, so that an input signal to one port is output from the next port in a sequence. For instance, in the example of FIG. 1 when circuit 100 is functioning as a circulator: an input signal input to port 110a may be output from port 110b, an input signal input to port 110b may be output from port 110c, ..., and an input signal input to port 110n may be output from port 110a.

In the example of FIG. 1, controller and signal source 105 may select any combination of the frequency, phase and amplitude of one or more input signals to be provided to the ports 110a, 110b, 110c, ..., 110n. Controller and signal source 105 may provide select particular values of input signal frequency, phase and amplitude and to select ports to which an input signal should be provided with the selected frequency, phase and amplitude in order to cause the circuit 100 to perform circulator or amplifier functions. The input signals provided by the controller and signal source 105 to the ports in order to excite the circuit 100 to perform circulator, amplifier, or other suitable functions are referred to collectively herein as "pump signals."

Input signals input to the ports may comprise pump signals which excite a resonance frequency of one of the modes of circuit 100 and may further comprise one or more information signals originating from a circuit to which circuit 100 is coupled (not shown) and which are provided as input such that circuit 100 can perform circulation and/or amplifier functions upon such information signal(s). For example, one or more of the ports 110a, 110b, 110c, ..., 110n may receive input pumping signals to excite resonances of the circuit such that the circuit 100 is configured to act as a circulator. At the same time or subsequently, an information signal input to one of the ports (which may, or may not, include a port to which a pumping signal is applied) may be output from the next port in the circulation sequence, as discussed above.

Irrespective of which input signals are provided to the ports, each port is coupled to one or more of the resonators 130a, 130b, ..., 130n via subcircuit 120 which routes each port to the one or more resonators to which it is coupled and may additionally provide circuit components along such routing paths.

According to some embodiments, subcircuit 120 includes one or more components that adjust the phase of a signal supplied to one of the ports 110a, 110b, 110c, ..., 110n before supplied the phase-adjusted version of the signal to one of the resonators 130a, 130b, ..., 130n. For example, a phase of a signal may be adjusted by some fixed amount, such as $\pi$, $\pi/2$, $\pi/4$, etc. In some cases, a phase-adjusted version of an input signal may be supplied to a first resonator of the resonators 130a, 130b, ..., 130n and in addition a non-phase-adjusted version of the same input signal may be supplied to a different resonator of the resonators 130a, 130b, ..., 130n. Such an approach may aid in exciting resonant frequencies of the circuit 100 since it may allow a pumping signal at a particular frequency to be supplied to two different resonators with different phases at the same time.

The resonators 130a, 130b, ..., 130n may have the same or difference dimensions and may be, for instance, superconducting resonators (e.g., transmission line resonators). According to some embodiments, one or more of the resonators may be capacitively coupled to the sub circuit 120. In some embodiments, the resonators 130a, 130b, ..., 130n are quarter wave or half wave resonators. In some embodiments, the resonators 130a, 130b, ..., 130n are quarter wave microwave resonators.

According to some embodiments, resonators 130a, 130b, ..., 130n may be arranged proximate to one another such that signals passing within such resonators cause resonance effects within each other. For example, two quarter wave resonators may be placed close to one another and end to end such that they are functionally equivalent to a half wave resonator. It will be appreciated that terms of fabrication, there may be a marginal difference between a case where resonators 130a, 130b, ..., 130n consist of only a number of n$\lambda$ resonators (where n is any value, such as 0.5) that are operating like twice as many n$\lambda$/2 resonators. Accordingly, it is within the spirit and scope of the example of FIG. 1 that the resonators 130a, 130b, ..., 130n represent such arrangements.

According to some embodiments, Josephson junctions 140a, 140b, ..., 140n may be equidistantly arranged around the loop 150. The loop 150 may have any suitable shape, and is not limited to the shape shown in FIG. 1. For example the loop 150 may be arranged as a square, rectangle, circle, ellipse, or any other suitable shape. As shown, the resonators 130a, 130b, ..., 130n are arranged to couple to the loop in between neighboring pairs of the Josephson junctions 140a, 140b, ..., 140n. While such an arrangement may be beneficial to arrange suitable couplings between the resonators, it will be appreciated that additional Josephson junctions may also be provided within the circuit loop 150 so long as suitable couplings between the resonators are provided.

Figure 2A:
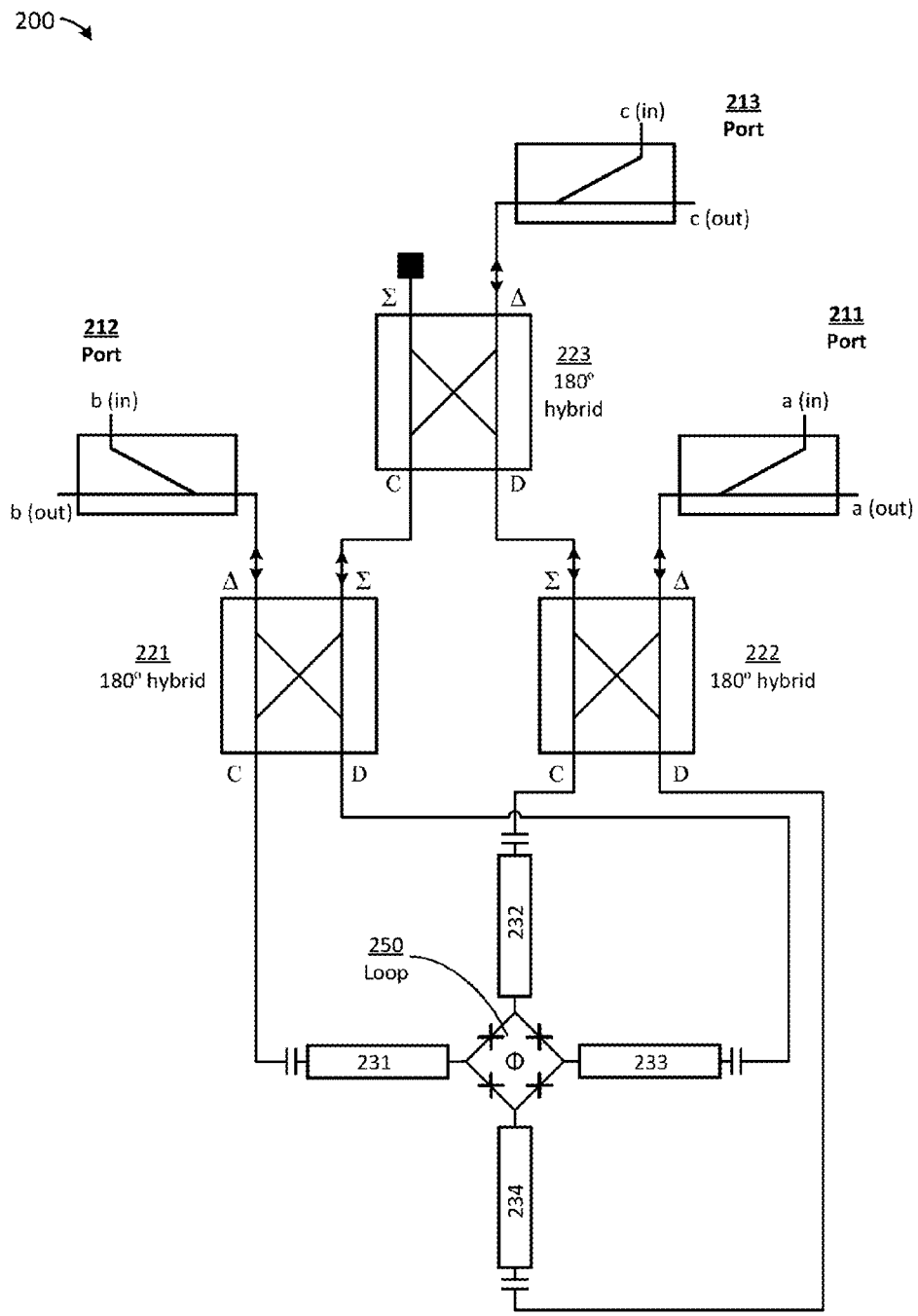
FIG. 2A is a block diagram of an integrated circulator/amplifier circuit having three ports and four resonators, according to some embodiments.
Figure 2B:
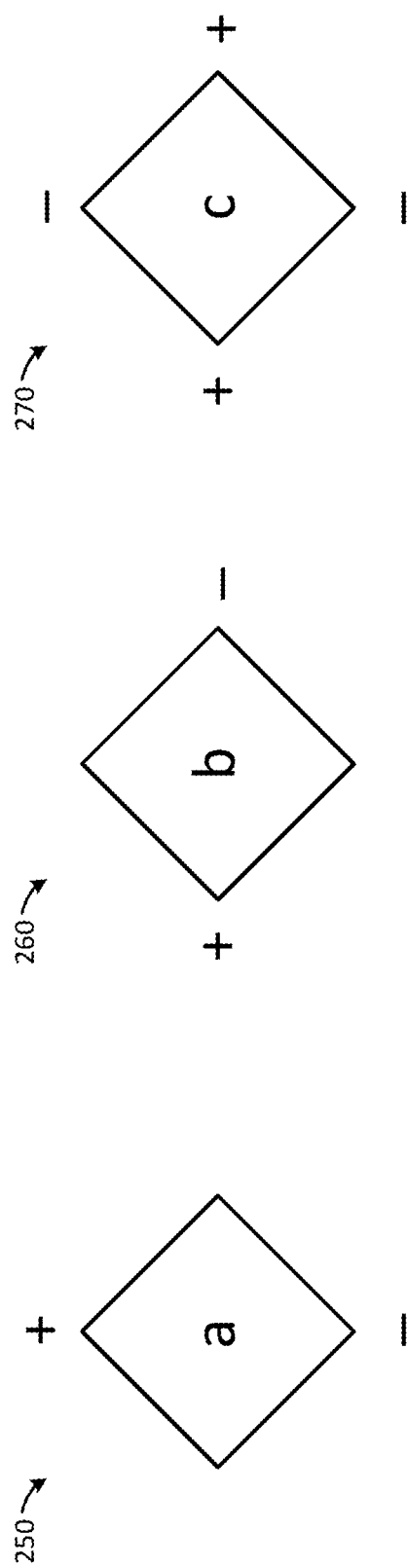
FIG. 2B illustrates spatial excitation patterns of three orthogonal resonance modes of the circuit of FIG. 2A, according to some embodiments.

FIG. 2A is a block diagram of an integrated circulator/amplifier circuit, according to some embodiments. Circuit 200 shown in FIG. 2A is a particular example of the more general circuit depicted in FIG. 1, with three ports and four resonators. FIG. 2B illustrates the spatial excitation patterns of three orthogonal resonance modes of circuit 200, as described further below.

In the example of FIG. 2A, the three ports 211, 212 and 213 are also labeled (and referred to herein) as ports a, b and c, respectively. The three ports are coupled to resonators 231, 232, 233 and 234 via one or more of the 180° hybrid units 221, 222 and 223. The resonators are coupled around a loop 250 in which four Josephson junctions are arranged equidistantly and interspersed between the four resonators. A magnetic flux Φ is directed through the interior of the loop 250, which may be generated by a suitable magnetic component (not shown). For example, Φ may be equal to half a flux quantum. In the example of FIG. 2A, each of the resonators 231-234 is coupled to the 180° hybrid units 221, 222 via a capacitor.

The 180° hybrid units 221, 222 and 223 are devices that output two equal amplitude in-phase signals when fed an input through the sum port (labeled "Σ" in FIG. 2A) and output two equal amplitude 180° out-of-phase signals when fed an input through the difference port (labeled "Δ" in FIG. 2A). Conversely, when signals are input through the ports labeled "C" and "D" in FIG. 2A, these signals will be output as a sum at the sum port (Σ) and as a difference of the two signals at the difference port (Δ). These devices are used in circuit 200 to prepare phase shifted versions of pumping signals to excite resonance modes, although generally any suitable device for performing such a task may have been used instead of the 180° hybrid units.

According to some embodiments, the resonators 231, 232, 233 and 234 may each be quarter wave resonators. According to some embodiments, the resonators 231, 232, 233 and 234 may be a pair of crossed resonators. For example, resonators 231 and 233 may be a first resonator crossed by the loop 250 and Josephson junctions, and resonators 232 and 234 may be a second resonator crossed by the loop and the Josephson junctions. For example, the loop 250 may be embedded at the central current antinodes of the two resonators. According to some embodiments, two such resonators may each be a half wave resonator such that 231, 232, 233 and 234 each function effectively as quarter wave resonators.

FIG. 2B illustrates the spatial excitation patterns of three orthogonal resonance modes of circuit 200, which will be described now in connection with FIG. 2A. In the discussion below, the resonators 231, 232, 233 and 234 are assumed to be two crossed resonators formed first from 232 and 234, and second from 231 and 233, which have resonant modes with frequencies $\omega_a$ and $\omega_b$, respectively.

The first mode 250, shown in FIG. 2B, may be excited by providing an input pumping signal into port a (211) shown in FIG. 2A. The input pumping signal enters the 180° hybrid 222 at the difference port and is therefore output to both resonators 232 and 234 with each of those outputs being 180° out of phase from one another. This phase difference is illustrated in FIG. 2B, which depicts the square shape of loop 250 with the relative phases of inputs to the resonators at corresponding positions around the loop depicted using "+" and "−" symbols. For the purposes of the discussion at present, it is not important that any of the modes, including this first mode which will henceforth be referred to the "a-mode" be excited using any particular absolute phase values, so long as there is a 180° difference between the phases. The "+" and "−" symbols shown in FIG. 2B are thus arbitrary and are intended merely to illustrate the relative phase difference between inputs to the resonators at the respective positions around the loop 250. In order to excite the "a-mode" of the circuit 200, the pumping signal input to port 211 may be at the resonant frequency $\omega_a$ of the resonator formed by resonators 232 and 234.

The second mode 260, shown in FIG. 2B, may be excited by providing an input pumping signal into port b (212) shown in FIG. 2A. The input pumping signal enters the 180° hybrid 221 at the difference port and is therefore output to both resonators 231 and 233 with each of those outputs being 180° out of phase from one another. This phase difference is illustrated in FIG. 2B, which depicts the square shape of loop 250 with the relative phases of inputs to the resonators at corresponding positions around the loop depicted using "+" and "−" symbols. As discussed above, these symbols are intended to convey relative phase, not absolute phase. In order to excite this "b-mode" of the circuit 200, the pumping signal input to port 212 may be at the resonant frequency $\omega_b$ of the resonator formed by resonators 231 and 233.

The third mode 270, shown in FIG. 2B, may be excited by providing an input pumping signal into port c (212) shown in FIG. 2A at the common mode frequency of the two other resonant modes (i.e., at a common mode of $\omega_a$ and $\omega_b$). This common mode frequency will hereafter be referred to as $\omega_c$. The input pumping signal enters the 180° hybrid 223 at the difference port and is therefore output to both the 180° hybrid 221 and the 180° hybrid 222 at their respective sum ports. The 180° hybrid 221 therefore outputs identical signals to resonators 231 and 233 whereas the 180° hybrid 222 also outputs identical signals to resonators 232 and 234, yet the signal output to resonators 231 and 233 is 180° out of phase with respect to the signal output to resonators 232 and 234 due to the function of 180° hybrid 223. This phase difference is illustrated in FIG. 2B, which shows the relative phase of the four resonators 270.

The inventors have recognized and appreciated that a circuit, such as circuit 100 shown in FIG. 1 or circuit 200 shown in FIG. 2A, may be off-resonantly pumped in order to couple together modes of the circuit to produce functionality associated with, for example, a circulator or an amplifier.

As discussed above in relation to the example of FIGS. 2A-2B, each of the three resonant modes of circuit 200 may be excited by providing a pumping input at a particular frequency ($\omega_a$, $\omega_b$ or $\omega_c$ at ports a, b or c, respectively). The example embodiments discussed below illustrate how pumping of a port at a different frequency from those resonant frequencies, yet at a frequency that is based on the resonant frequencies of at least some of the modes, may allow gain or conversion functions to be performed between ports of the circuit 200. These gain and conversion functions may be combined in a suitable manner such that circuit 200 performs, for example, as a circulator or a directional amplifier, although other functions may be possible using the same circuit and by providing suitable pumping inputs to the ports.

Figure 3A:
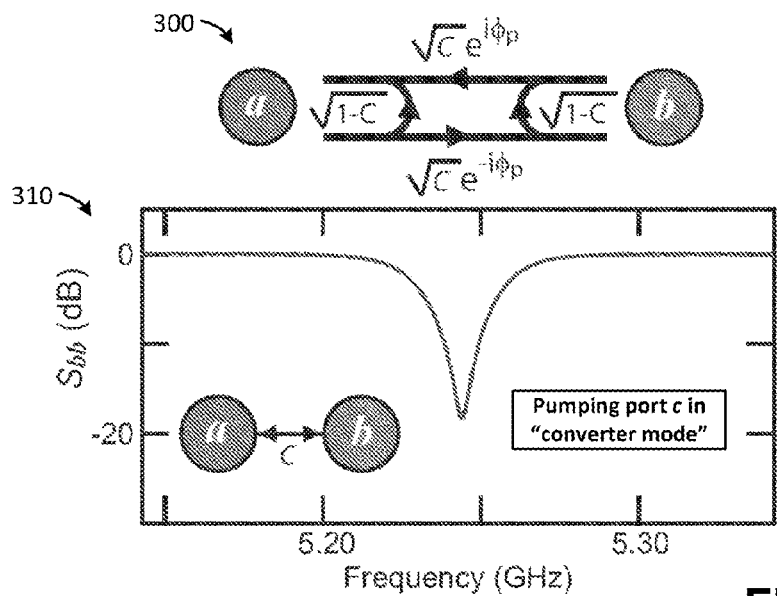
FIG. 3A illustrates pumping a port of the circuit of FIG. 2A to produce conversion between the other two ports, according to some embodiments.

FIG. 3A illustrates pumping one port of the circuit of FIG. 2A to produce conversion between the other remaining ports, according to some embodiments. In the example of FIG. 3A, port c (213) of FIG. 2A is pumped at a frequency equal to the difference between the resonant frequencies of the two other ports a (211) and b (212). That is, port c is pumped at a frequency $\omega_c^p = |\omega_a - \omega_b|$. This causes a conversion process between ports a and b in which incident signals are either reflected (with coefficient $\sqrt{1-C}$), or transmitted with coefficient $\sqrt{C}$. Signals transmitted through the device in this manner experience a pump-phase dependent non-reciprocal shift (where the pump-phase is labeled $\phi_p$ in the figure).

The diagram 300 in FIG. 3A illustrates a graphical representation of the scattering matrix produced by this conversion operation. In the example of FIG. 3A, chart 310 illustrates the b->b component of the scattering matrix $S_{bb}$ plotted against a probe frequency. As shown, there is a dip at a frequency $\omega_b$ (which, in this example is approximately equal to 5.25 GHz) where photons have been up-converted from $\omega_b$ to $\omega_a$, with conversion coefficient C given by approximately 1−C=−18 dB.

While the example of FIG. 3A illustrates conversion between ports a and b by appropriate pumping of port c, similar conversion operations may be performed by pumping at ports a and b as well. That is, by pumping at port a at a frequency $\omega_a^P = \oplus\omega_b - \omega_c|$, conversion between ports b and c may be induced; and by pumping at port b at a frequency $\omega_b^P = |\omega_c - \omega_a|$, conversion between ports c and a may be induced.

Figure 3B:
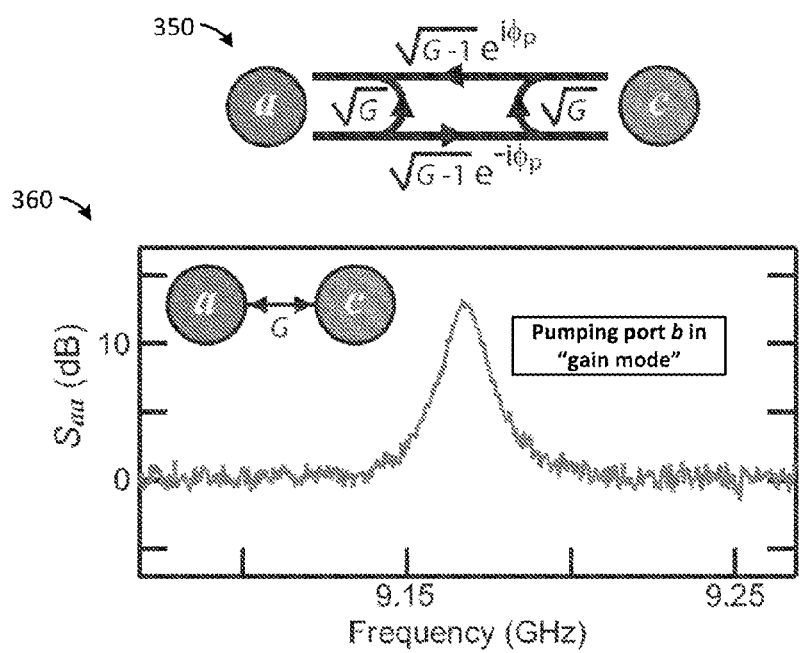
FIG. 3B illustrates pumping a port of the circuit of FIG. 2A to produce gain between the other two ports, according to some embodiments.

FIG. 3B illustrates pumping a port of the circuit of FIG. 2A to produce gain between the other two ports, according to some embodiments. In the example of FIG. 3B, port b (212) of FIG. 2A is pumped at a frequency equal to the sum of the resonant frequencies of the two other ports a (211) and c (213). That is, port b is pumped at a frequency $\omega_b^P = \omega_a + \omega_c$. This causes a gain process between ports a and c in which incident signals are either amplified in reflection with voltage gain $\sqrt{G}$, or transmitted with gain $\sqrt{G-1}$, together with a pump-phase dependent non-reciprocal phase shift $\phi_p$. A signal incident on one port may be combined with amplified vacuum-fluctuations from the other port, achieving phase-preserving amplification. Due to the symmetry of the amplification process, the amplified signal can be collected from either output port.

The diagram 350 in FIG. 3B illustrates a graphical representation of the scattering matrix produced by this gain operation. In the example of FIG. 3B, chart 360 illustrates the a->a component of the scattering matrix $S_{aa}$ plotted against a probe frequency. As shown, there is a peak at a frequency $\omega_a$ (which, in this example is approximately equal to 9.15 GHz) where photons have been amplified.

While the example of FIG. 3B illustrates gain at ports a and c by appropriate pumping of port b, similar gain operations may be performed by pumping at ports a and c as well. That is, by pumping at port a at a frequency $\omega_a^P = \omega_b + \omega_c$, gain at ports b and c may be induced; and by pumping at port b at a frequency $\omega_b^P = \omega_c + \omega_a$, gain at ports c and a may be induced.

In the example of FIGS. 3A-3B, the resonant modes with frequency $\omega_a$ and $\omega_b$ are taken to have energy decay rates $\kappa_a$, $\kappa_b$ respectively. In the conversion process shown in FIG. 3A, provided that the pump frequency $\omega_c^P$ is sufficiently detuned from any harmonic of the c-mode, the pump can be approximated as a classical drive and the interaction Hamiltonian can be written as:

$$\mathcal{H}_{int}^C = g_{ab}(ab^\dagger e^{i\phi_p} + a^\dagger b e^{-i\phi_p}),$$

where $a^\dagger$ and a; and $b^\dagger$ and b are the creation and annihilation operators for their respective modes a and b; $g_{ab}$ is the pump-power-dependent coupling; and $\phi_p$ is the pump phase. The conversion process is then characterized by the conversion coefficient at zero detuning:

$$\sqrt{C} = (2|g_{ab}|^2/\kappa_a\kappa_b)/(1+|g_{ab}|^2/\kappa_a\kappa_b),$$

whose value ranges from 0 (no-conversion) to 1 (full-conversion when $g_{ab} = \sqrt{\kappa_a\kappa_b}$).

Similarly, in the gain process shown in FIG. 3B, the interaction Hamiltonian can be written as:

$$\mathcal{H}_{int}^G = g_{ab}(a^\dagger b^\dagger e^{i\phi_p} + abe^{-i\phi_p}),$$

The gain of the resulting amplification process at zero detuning can then be written as $\sqrt{G} = (1+|g_{ab}|^2/\kappa_a\kappa_b)/(1-|g_{ab}|^2/\kappa_a\kappa_b)$. High gain is achieved for $|g_{ab}|^2 \to \kappa_a\kappa_b$.

Figure 4:
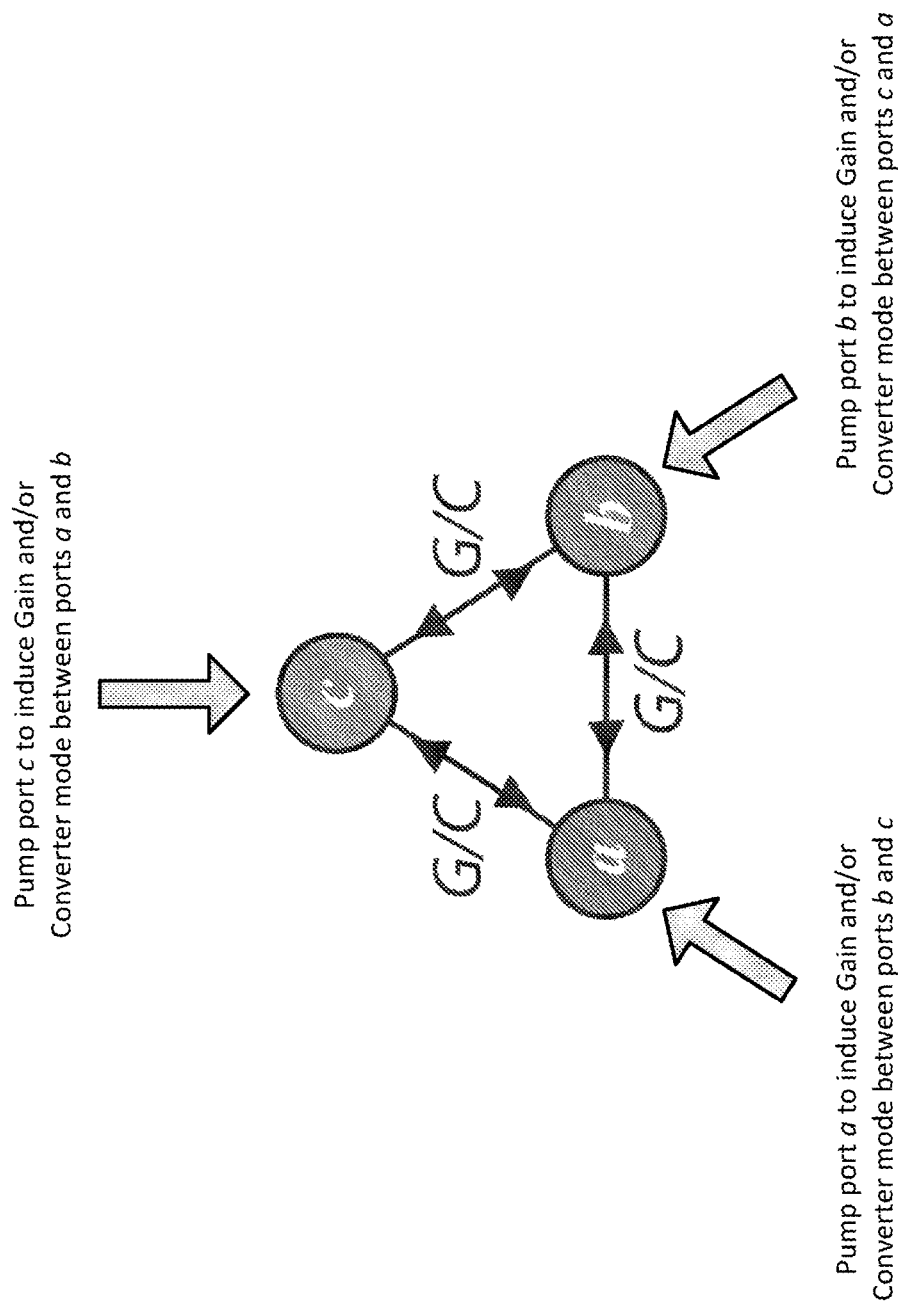
FIG. 4 illustrates various ways in which the circuit of FIG. 2A may be pumped to produce combinations of conversion and gain functions, according to some embodiments.

As per the above description, it is clear that each of the three ports in the illustrative circuit 200 shown in FIG. 2A may be pumped in either or both of two ways. That is, each may be pumped according to the conversion process described above and/or pumped according to the gain process described above. Since both processes utilize pumping frequencies that would generally be different at each port, they are generally compatible with one another and could in theory be applied at the same time. FIG. 4 illustrates various ways in which the circuit of FIG. 2A may be pumped to produce combinations of conversion and gain functions, according to some embodiments.

The inventors have recognized and appreciated that a circuit such as circuit 200 may be operated using a suitable combination of the above-described conversion operations to cause the circuit to function as a circulator. While, as described above, when the circuit is excited as a converter between ports the energy can flow in both directions between those ports (thereby perhaps creating a device that resembles a gyrator with a frequency translation more than a circulator), the inventors have recognized that by appropriately tuning the phases and frequencies of pump inputs to the circuit, the device may nonetheless function as a reversible circulator. This pumping configuration with respect to the illustrative circuit of FIG. 2A will now be described.

Figure 5A:
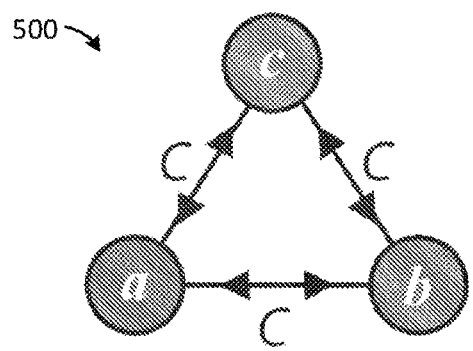
FIGS. 5A-5C illustrate operation of the circuit of FIG. 2A as a reversible circulator, according to some embodiments.
Figure 5B:
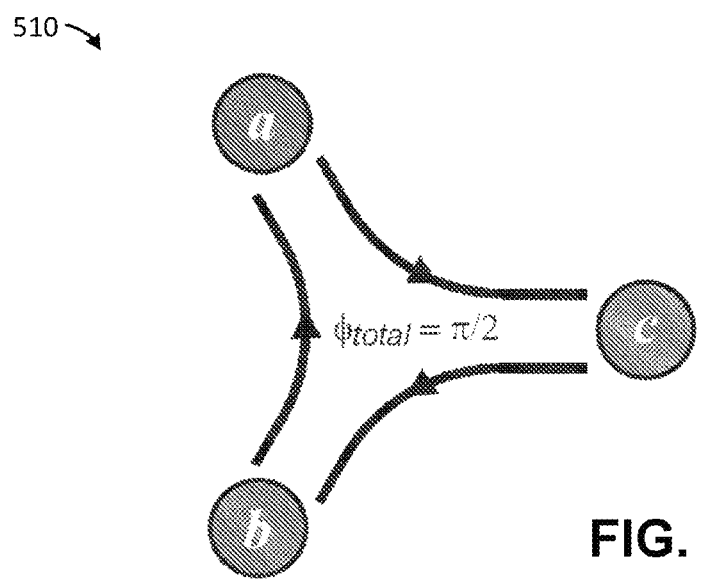
Figure 5C:
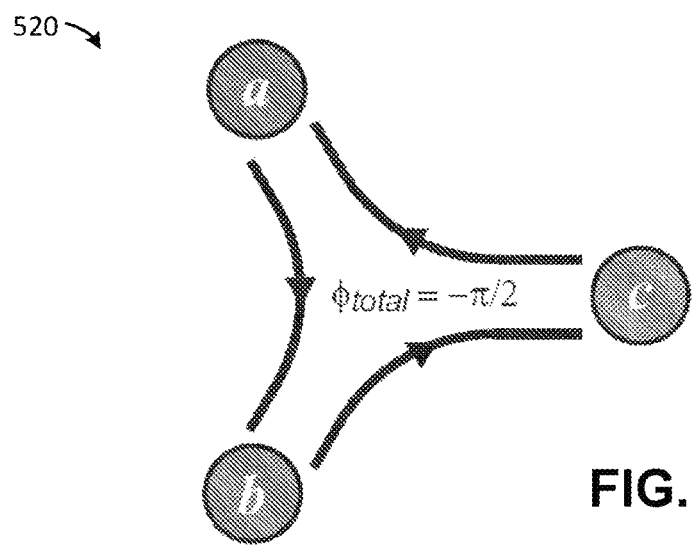

FIGS. 5A-5C illustrate operation of the circuit of FIG. 2A as a reversible circulator, according to some embodiments. The circuit 200 shown in FIG. 2 may be operated as a circulator by pumping each of the three ports in the "conversion mode" described above—that is, at a frequency equal to the difference between the resonant frequencies of the other two ports ($\omega_a^P = |\omega_b - \omega_c|$, $\omega_b^P = |\omega_c - \omega_a|$, and $\omega_c^P = |\omega_b - \omega_a|$), and the three pumping signals at ports a, b and c have phases $\phi_a$, $\phi_b$ and $\phi_c$, respectively. Specifically, the circuit 200 will act as a circulator if $\phi_{tot}^{circ} = \phi_a + \phi_b - \phi_c = \pm\pi/2$ or odd-integer multiples thereof.

In the ideal case, the circulator 500 uses three conversion processes that would each individually achieve full conversion (C=1). Positive or negative interference occurs as signals travel around the device, their phase being controlled by $\phi_{tot}^{circ}$, which is believed to act here like a gauge flux, playing the role of the magnetic field in a conventional circulator. According to some embodiments, the amplitude (power) of the three pumping signals of FIG. 5A are equal, or substantially equal, to one another.

As shown in FIG. 5B, for $\phi_{tot}^{circ} = +\pi/2$, a matched circulator with clockwise circulation is created. In general, any odd-integer multiple of $\pi/2$ will also produce the same result (i.e., $3\pi/2$, $5\pi/2$, etc.). Similarly, as shown in FIG. 5C, for $\phi_{tot}^{circ} = -\pi/2$, a matched circulator with counter-clockwise circulation is created. In general, any odd-integer multiple of $-\pi/2$ will also produce the same result (i.e., $-3\pi/2$, $-5\pi/2$, etc.).

It is noted that that this circulator is somewhat different from a ferrite-based circulator in that it translates the frequencies of signals passing through it, but at least in some implementations this may be of little practical consequence since the center frequency of signals can be shifted without degrading their information content.

As one non-limiting example, $\omega_a = 9.18$ GHz, $\omega_b = 5.25$ GHz, $\omega_c = 7.17$ GHz, and the circulator may be operated by pumping at $\omega_a^P = 1.92$ GHz, $\omega_b^P = 2.01$ GHz, and $\omega_c^P = 3.93$ GHz such that the phases of the three input pumping signals combine such that $\phi_{tot}^{circ} = \phi_a + \phi_b - \phi_c = \pm n\pi/2$ where n is an odd integer. The direction of the circulator may be switched simply by changing the phase of one or more of the pumping signals (e.g., if $\phi_a = \phi_b = \pi/4$ and $\phi_c = 0$, thereby producing a clockwise circulator, $\phi_c$ may be adjusted to be equal to $-\pi$, thus adjusting the direction of the circulator to counterclockwise simply by changing the phase of only one of the pumping inputs.

FIGS. 6A-6D illustrate operation of the circuit of FIG. 2A as a directional amplifier, according to some embodiments. The circuit 200 shown in FIG. 2A may be operated as a directional amplifier by, as shown in FIG. 6A, pumping two of the three ports in the "gain mode" described above and the other port in the "conversion mode." That is, two ports are each pumped at a frequency equal to the sum of the resonant frequencies of the other two ports, and the remaining port is pumped at a frequency equal to the difference between the other two ports (e.g., $\omega_a^P = \omega_b + \omega_c$, $\omega_b^P = \omega_c + \omega_a$, and $\omega_c^P = \omega_a - \omega_b$). If the three pumping signals at ports a, b and c have phases $\phi_a$, $\phi_b$ and $\phi_c$, respectively, then for the circuit to function as a direction amplifier a combined phase is equal to $\phi_{tot}^{da} = \phi_a - \phi_b + \phi_c = \pm \pi/2$ or odd-integer multiples thereof. According to some embodiments, the amplitude (power) of the three pumping signals are equal, or substantially equal, to one another.

Unlike the circulator, the directional amplifier has a pronounced asymmetry in signal flow through the device, as shown by the graphical scattering matrix 610 in FIG. 6B. The roles played by the three ports in the directional amplifier are labeled as the Signal (S) input, Idler (I) input, and Vacuum (V) inputs. The S port is matched (no power reflects), and incident power is instead transmitted with gain to the I and V ports. Vacuum fluctuations incident on I are responsible for the additional amplified quantum fluctuations necessarily associated with phase-preserving amplification.

Either port I or V in FIG. 6B can be considered to be the directional amplifier's output. The V port is noiselessly and directionally transmitted through the device to the S port with unity gain. At least in some implementations, this may be required by for quantum-limited amplification (sending it to either of the other 2 output ports would degrade the noise performance of the device), and the information conserving nature of the device (no entropy produced, assuming the pump to be perfectly stiff).

In the example of FIGS. 6A-6D, the sign of $\phi_{tot}^{da}$ determines which physical port plays the role of S and V, with I remaining unchanged. When $\phi_{tot}^{da} = +n\pi/2$ in the example configuration of FIG. 6A, port a plays the S role and port b the V role, whereas when When $\phi_{tot}^{da} = -n\pi/2$ in the example configuration of FIG. 6A, port a plays the V role and port b the S role.

The roles can be further re-mapped by changing which pair of modes is linked via conversion and thus, in general, each of the three physical ports can play each role. For example, changing which of the ports in FIG. 6A is the port pumped in the conversion mode and which two ports are pumped in the gain mode will allow production of a directional amplifier in which any of the ports may be selected to play any of the V, S or I roles. Since such configuration is based purely on frequency and/or phase of the pumping signals, a directional amplifier that can be easily adapted during operation may be produced.

Moreover, it will be apparent that since the same circuit may be pumped to act as a reversible circulator or a directional amplifier, both functions may be easily produced from the same circuit by altering the frequency and/or phase of pumping signals.

While illustrative circuits described above utilize Josephson junctions, the techniques described herein are not necessarily limited to the use of Josephson junctions or to superconducting resonators. Indeed other types of devices that provide non-linear couplings and other types of resonators may also be envisioned and used in the types of circuits described above.

Further, it will be appreciated that while mathematical relationships between frequencies and phases are outlined above, they are intended to represent ideal circumstances and that minor deviations from such relationships may produce results substantially the same as mathematically precise values. For instance, where a pumping frequency would be, say 2 GHz as implied by a mathematical formula given above, frequencies very close to 2 GHz may also produce useful, if not identical results. For instance, in some cases, frequencies between 1980 MHz and 2020 MHz may be expected to produce the same, or substantially similar, results as would a frequency of 2000 MHz. Accordingly, frequencies and phases that deviate less than 1% from the ideal mathematical value may be considered, for the purposes of the above discussion, to comport with the spirit of the technical aspects discussed.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A circuit, comprising:
    a plurality of Josephson junctions arranged in series in a loop;
    at least one magnetic element producing magnetic flux through the loop;
    a plurality of superconducting resonators, each resonator coupled to the loop between a different neighboring pair of Josephson junctions of the plurality of Josephson junctions;
    a plurality of ports, each port coupled to at least one of the plurality of resonators at ends of the resonators opposite to ends at which the resonators are coupled to the loop; and
    at least one controller configured to provide input energy to each of the plurality of ports that causes the circuit to function as a circulator between the plurality of ports.

2. The circuit of claim 1, wherein the plurality of superconducting resonators are each capacitively coupled to one or more of the plurality of ports.

3. The circuit of claim 1, wherein the plurality of Josephson junctions are positioned equidistantly around the loop.

4. The circuit of claim 1, wherein the input energy comprises pumping signals provided to each of the plurality of ports, the pumping signals having different frequencies at each of the plurality of ports.

5. The circuit of claim 1,
    wherein the input energy comprises a first pumping signal input to a first port of the plurality of ports, a second pumping signal input to a second port of the plurality of ports, and a third pumping signal input to a third port of the plurality of ports,
    wherein the first port is associated with a first resonant mode of the circuit having a first resonance frequency,
    wherein the second port is associated with a second resonant mode of the circuit having a second resonance frequency, and
    wherein the third port is associated with a third resonant mode of the circuit having a third resonance frequency.

6. The circuit of claim 5, wherein the first pumping signal has a first primary frequency equal to a difference between the second resonance frequency and the third resonance frequency.

7. The circuit of claim 6, wherein the second pumping signal has a second primary frequency equal to a difference between the first resonance frequency and the third resonance frequency, and wherein the third pumping signal has a third primary frequency equal to a difference between the first resonance frequency and the second resonance frequency.

8. The circuit of claim 5, wherein, in a first operating mode, the circulator functions in a first direction between the plurality of ports, and wherein a phase of the first pumping signal plus a phase of the second pumping signal minus a phase of the third pumping signal is equal to an odd integer multiple of $\pi/2$.

9. The circuit of claim 8, wherein, in a second operating mode, the phase of the first pumping signal plus the phase of the second pumping signal minus the phase of the third pumping signal is equal to an odd integer multiple of $-\pi/2$, and wherein the circulator functions in a second direction between the plurality of ports, opposite to the first direction of the first operating mode.

10. The circuit of claim 1, wherein the input energy is first input energy, and wherein the at least one controller is further configured to provide second input energy to each of the plurality of ports, different from the first input energy, that causes the circuit to function as a directional amplifier.

11. The circuit of claim 10, wherein the second input energy comprises a first pumping signal input to a first port of the plurality of ports, a second pumping signal input to a second port of the plurality of ports, and a third pumping signal input to a third port of the plurality of ports,
    wherein the first port is associated with a first resonant mode of the circuit having a first resonance frequency,
    wherein the second port is associated with a second resonant mode of the circuit having a second resonance frequency,
    wherein the third port is associated with a third resonant mode of the circuit having a third resonance frequency, and
    wherein the first pumping signal has a first primary frequency equal to a sum of the second resonance frequency and the third resonance frequency.

12. The circuit of claim 11,
    wherein the second pumping signal has a second primary frequency equal to a difference between the first resonance frequency and the third resonance frequency, and
    wherein the third pumping signal has a third primary frequency equal to a sum of the first resonance frequency and the second resonance frequency.

13. A method of operating a circuit, the circuit comprising a plurality of Josephson junctions arranged in series in a loop, at least one magnetic element producing magnetic flux through the loop, a plurality of superconducting resonators, each resonator coupled to the loop between a different neighboring pair of Josephson junctions of the plurality of Josephson junctions, a plurality of ports, each port coupled to at least one of the plurality of resonators at ends of the resonators opposite to ends at which the resonators are coupled to the loop, the method comprising:
    providing a distinct input pumping signal to each of the plurality of ports to cause the circuit to function as a circulator between the plurality of ports.

14. The method of claim 13, wherein each input pumping signal has a different frequency.

15. The method of claim 13, wherein a first input pumping signal is input to a first port of the plurality of ports, a second input pumping signal is input to a second port of the plurality of ports, and a third input pumping signal is input to a third port of the plurality of ports,
    wherein the first port is associated with a first resonant mode of the circuit having a first resonance frequency,
    wherein the second port is associated with a second resonant mode of the circuit having a second resonance frequency,
    wherein the third port is associated with a third resonant mode of the circuit having a third resonance frequency, and
    wherein the first input pumping signal has a first primary frequency equal to a difference between the second resonance frequency and the third resonance frequency.

16. The method of claim 15, wherein the second input pumping signal has a second primary frequency equal to a difference between the first resonance frequency and the third resonance frequency, and wherein the third input pumping signal has a third primary frequency equal to a difference between the first resonance frequency and the second resonance frequency.

17. The method of claim 15, wherein, in a first operating mode, the circulator functions in a first direction between the plurality of ports, and wherein a phase of the first input pumping signal plus a phase of the second input pumping signal minus a phase of the third input pumping signal is equal to an odd integer multiple of $\pi/2$.

18. The method of claim 17, wherein, in a second operating mode, the phase of the first input pumping signal plus the phase of the second input pumping signal minus the phase of the third input pumping signal is equal to an odd integer multiple of $-\pi/2$, and wherein the circulator functions in a second direction between the plurality of ports, opposite to the first direction of the first operating mode.

* * * * *